US011791189B2

United States Patent
Pape et al.

(10) Patent No.: US 11,791,189 B2
(45) Date of Patent: Oct. 17, 2023

(54) REFLECTOMETER TO MONITOR SUBSTRATE MOVEMENT

(71) Applicant: Lam Research Corporation, Fremont, CA (US)

(72) Inventors: Eric A. Pape, Acton, CA (US); Dmitry Opaits, Fremont, CA (US); Jorge Luque, Redwood City, CA (US); Jeffrey D. Bonde, San Jose, CA (US); Siyuan Tian, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 1413 days.

(21) Appl. No.: 16/153,383

(22) Filed: Oct. 5, 2018

(65) Prior Publication Data

US 2020/0111696 A1  Apr. 9, 2020

(51) Int. Cl.
*H01L 21/68* (2006.01)
*G01B 21/12* (2006.01)
(Continued)

(52) U.S. Cl.
CPC .......... *H01L 21/681* (2013.01); *G01B 21/12* (2013.01); *G01B 21/24* (2013.01); *G01N 21/956* (2013.01);
(Continued)

(58) Field of Classification Search
CPC . G03F 7/70625; G01B 11/24; G01B 2210/56; G01N 21/956; G01N 2021/213
See application file for complete search history.

(56) References Cited

U.S. PATENT DOCUMENTS 6,813,032 B1 11/2004 Hunter
9,404,872 B1 * 8/2016 Wang .................. G01N 21/274
(Continued)

FOREIGN PATENT DOCUMENTS

WO  WO-2020072187 A1  4/2020

OTHER PUBLICATIONS

International Application Serial No. PCT/US2019/051154, International Preliminary Report on Patentability dated Apr. 15, 2021, 10 pgs.
(Continued)

*Primary Examiner* — Savitri Mulpuri
(74) *Attorney, Agent, or Firm* — Schwegman Lundberg & Woessner, P.A.

(57) ABSTRACT

Various embodiments include a reflectometer and a reflectometry system for monitoring movements of a substrate, such as a silicon wafer. In one embodiment, a reflectometry system monitors and controls conditions associated with a substrate disposed within a process chamber. The process chamber includes a substrate-holding device having an actuator mechanism to control movement of the substrate with respect to the substrate-holding device. The reflectometry system includes a light source configured to emit a beam of light directed at the substrate, collection optics configured to receive light reflected from the substrate by the beam of light directed at the substrate and output a signal related to one or more conditions associated with the substrate, and a processor configured to process the signal and direct the actuator mechanism to control the movement of the substrate with respect to the substrate-holding device based on the signal. Other devices and methods are disclosed.

29 Claims, 6 Drawing Sheets

(51) Int. Cl.
*G01N 21/956* (2006.01)
*G01S 17/48* (2006.01)
*H01L 21/683* (2006.01)
*G01B 21/24* (2006.01)
*H01L 21/67* (2006.01)

(52) U.S. Cl.
CPC .......... *G01S 17/48* (2013.01); *H01L 21/6833* (2013.01); *H01L 21/67288* (2013.01)

(56) References Cited

U.S. PATENT DOCUMENTS

| | | | |
|---|---|---|---|
| 10,312,121 B2* | 6/2019 | Musselman | H01L 21/681 |
| 2005/0030524 A1 | 2/2005 | Perry et al. | |
| 2005/0045821 A1 | 3/2005 | Noji et al. | |
| 2009/0088887 A1 | 4/2009 | Chen et al. | |
| 2014/0166862 A1* | 6/2014 | Flock | G01N 21/9501 |
| | | | 250/208.2 |
| 2014/0375981 A1* | 12/2014 | Wang | G01N 21/956 |
| | | | 356/51 |
| 2016/0225656 A1 | 8/2016 | Rye et al. | |
| 2016/0334326 A1* | 11/2016 | Sapiens | G01B 11/24 |
| 2018/0061691 A1* | 3/2018 | Jain | H01L 21/67253 |
| 2019/0094130 A1* | 3/2019 | Blasenheim | G01B 11/02 |

OTHER PUBLICATIONS

"International Application Serial No. PCT/US2019/051154, International Search Report dated Dec. 26, 2019", 4 pgs.
"International Application Serial No. PCT/US2019/051154, Written Opinion dated Dec. 26, 2019", 7 pgs.

* cited by examiner

REFLECTOMETER TO MONITOR SUBSTRATE MOVEMENT

TECHNICAL FIELD

The subject matter disclosed herein relates to equipment used in the semiconductor and allied industries. More specifically, the disclosed subject matter relates to monitoring a position of a substrate in various types of semiconductor process and metrology tools.

BACKGROUND

Generally, various pieces of semiconductor process equipment (e.g., material deposition and etch tools) use three pressure-driven pin lifters to raise and lower various types of substrates (e.g., semiconductor substrates including silicon wafers, germanium wafers, compound-semiconductor wafers, as well as quartz photomasks, flat panel display substrates, and other types of substrates known in the semiconductor and allied industries) onto an electrostatic chuck (ESC) or other substrate-holding device. The ESC is known to a person of ordinary skill in the art and is commonly used in, for example, plasma-based and vacuum-based semiconductor processing. The ESC is used to mount and electrostatically "clamp" a substrate during semiconductor processing but is also used to cool or heat substrates and provide flattening of the substrate, thereby increasing uniformity of processing.

Typically, a sequence of chucking and de-chucking operations includes the operations described below. A substrate is transferred into a process chamber with an end-effector of a robotic arm. Generally, three sapphire or metal substrate lift pins move up and receive the substrate from the robotic arm while the lift pins are in a raised or "up position." After the robotic arm is retracted from the process chamber, the previously raised lift pins move to a lowered or "down position." The lift pins retract to just below (e.g., typically by just tens of microns) a top surface of the ESC, thereby leaving the substrate to land on a top, ceramic surface of the ESC. The ESC begins "chucking" the substrate by applying a high voltage to electrodes that are embedded inside the ceramic surface of the ESC (for conductor coulombic ESCs, both positive and negative voltages are applied). Once the process is completed, the high voltage applied to the ESC is reset to zero to remove all charges. The lift pins are then raised to the up position to lift the substrate off of the ESC and the robotic arm removes the substrate from the process chamber.

However, electric charges are frequently trapped at or near the ESC surface, thereby creating residual chucking forces between the substrate and the ESC. When the lift pins are raised, during a substrate de-chucking operation, the residual chucking forces may cause unwanted substrate movement, such as bending, tilting, jumping, lateral sliding, and other movements that are potentially deleterious to semiconductor processing operations. In a worst-case scenario, the substrate may break while being separated from the ESC.

The information described in this section is provided to offer the skilled artisan a context for the following disclosed subject matter and should not be considered as admitted prior art.

DETAILED DESCRIPTION

Figure 1:
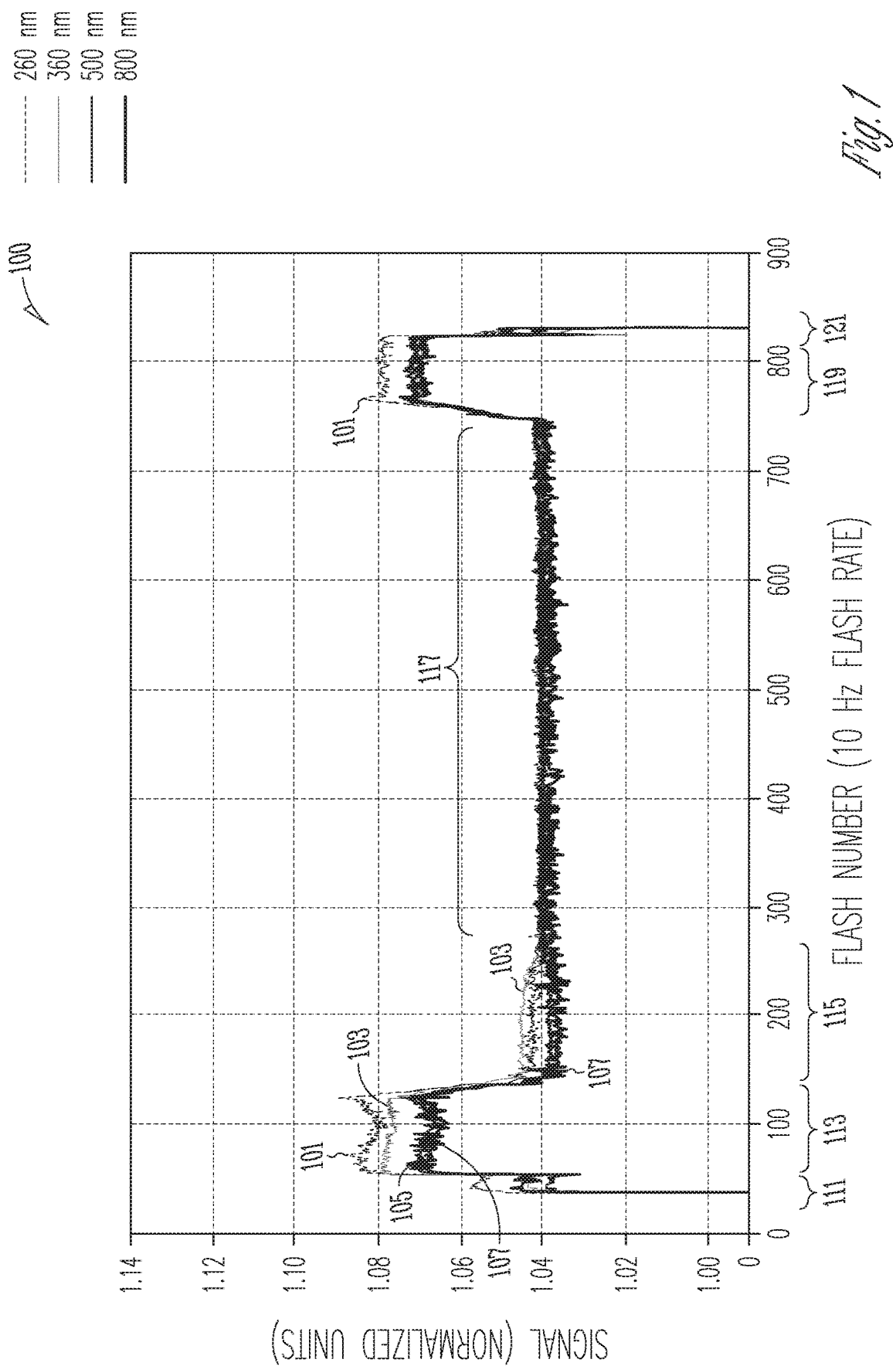
FIG. 1 shows an exemplary graph of data from a first type of reflectometer to evaluate feasibility of the reflectometer in monitoring movements of a substrate during various time periods near or on an electrostatic chuck (ESC)

The disclosed subject matter will now be described in detail with reference to a few general and specific embodiments as illustrated in various ones of the accompanying drawings. In the following description, numerous specific details are set forth in order to provide a thorough understanding of the disclosed subject matter. It will be apparent, however, to one skilled in the art, that the disclosed subject matter may be practiced without some or all of these specific details. In other instances, well-known process steps or structures have not been described in detail so as not to obscure the disclosed subject matter.

As is known in the art, occasionally, a substrate remains clamped after a de-chucking process has begun. When lift pins attempt to lift a substrate from the ESC (or other type of substrate-holding device known in the art) and the clamping forces keep the substrate from being released from the ESC, any excessive forces caused by the lift pins attempting to raise the substrate may instead break the substrate. As disclosed herein, various types of reflectometers (including sensors capable of sensing reflected light from a substrate and sensors capable of detecting both reflected light and scattered light from the substrate) can be used to detect and confirm substrate movement. The disclosed subject matter therefore can detect a successful de-chucking operation of the substrate from the ESC and thereby prevent or reduce deleterious effects, such as broken substrates. As used herein, the term "light" may refer to both light in the visible electromagnetic spectrum as well as light in other portions of the electromagnetic spectrum including ultraviolet (UV) and infrared (IR).

Currently, a spectral reflectometer (also known as a spectroreflectometer or reflectometer) is typically used to measure substrate reflectance by directing a collimated beam of light at the center portion of a substrate and measuring a magnitude of a returned signal from the substrate. This returned signal is used to determine an end point of a given process (e.g., the reflectivity of the substrate changes as layers of material are added or while material is removed during an etch process).

However, the investigators associated with the disclosed subject matter have determined that the returned signal is also sensitive to a position of the substrate (e.g., a vertical position), or a change in the position of the substrate, due to the change in distance between the substrate and a detector within the reflectometer, as described in more detail with reference to FIG. 2, below. Additionally, if one or more of the lift pins gets stuck or otherwise fails to lift the substrate from the ESC on one or more sides of the substrate, the substrate becomes tilted and a magnitude of the signal returned to the reflectometer decreases in intensity. Therefore, these sensitivities of the returned signal to the reflectometer as a function of substrate position can be used for fault detection in at least the following cases:

1) Confirm that the substrate is de-chucked when applying a low force to the lift pins prior to increasing the force to one or more lift pins;
2) If the signal received by the reflectometer does change while the lift pins are being raised, the reflectometer senses that the substrate is lifting;
3) Noise on the received signal (or a collection of received signals) may indicate that there is excessive vibration on the substrate(s), which may be indicative of potential or actual failure of one or more lift pins; and
4) Detection of lateral slippage of the substrate.

Other types of fault detection by the reflectometer, or multiple reflectometers in some embodiments, interacting with a substrate are described herein.

Referring now to FIG. 1, an exemplary graph 100 shows data from a reflectometer to evaluate feasibility of the reflectometer in monitoring movements of a substrate near or on an ESC during various time periods. The exemplary graph 100 is displayed as an electrical signal in arbitrary, normalized units) received by the reflectometer from a substrate. The substrate was reflecting light from the reflectometer and directed onto an uppermost surface of the substrate (described in more detail with reference to FIG. 2, below). In this particular embodiment, the reflectometer uses a broadband source as the light source. However, in other embodiments described herein, the light source may be a monochromatic or other source of either light and/or another type of radiation.

The magnitude of the signal is shown as a function of flash number, which is indicative of either the frequency of the flash-lamp used for the broadband source, or how frequently the reflected signal from the substrate is sampled, or both. In this embodiment, the light source comprised a xenon flash-lamp with the signal sampled at a rate of 10 Hz. Since this embodiment uses a broadband source, FIG. 1 is shown to include a number of graph lines indicative of various wavelengths within the broadband source including a first line 101 from a portion of the broadband spectrum at 260 nm, a second line 103 from a portion of the broadband spectrum at 360 nm, a third line 105 from a portion of the broadband spectrum at 500 nm, and a fourth line 107 from a portion of the broadband spectrum at 800 nm.

With continuing reference to FIG. 1, and during a first time-period 111, an end effector of a robotic arm moves the substrate into a process chamber. As the substrate is being moved into the chamber, lift pins on the ESC are raised to a "pins-up position" during a second time-period 113. The substrate is subsequently placed on the lift pins and lowered down to a surface of the ESC. During a third tune-period 115, the substrate is in contact, or near contact, with an uppermost surface of the ESC. As described above, one or more voltages are then applied to the ESC and the substrate is electrostatically "clamped" to the ESC during a fourth time-period 117. It is during the fourth time-period 117 that processing (e.g., material deposition, etching operations, etc.) of the substrate takes place. However, in preparing and recording the data for the exemplary graph 100, no actual processing was performed.

After the end of the fourth time-period 117, the voltage or voltages applied to the ESC are removed and the substrate is raised by the lift pins to a "pins-up position" during a fifth time-period 119. The end effector of the robotic arm then enters the process chamber and removes the substrate from the process chamber during a sixth time-period 121.

However, it is during the fifth time-period 119 when the voltage or voltages applied to the ESC are removed, and the substrate is to be raised by the lift pins to the "pins-up position," that a de-chuck problem may occur. The reflectometer detects whether the substrate has actually been lifted, or has been fully lifted, from the ESC. Further, as described in more detail below, the reflectometer is also able to determine whether the substrate is tilted due to at least one portion of the substrate not lifting from the ESC.

For example, presume there are three lift pins used to lower and raise the substrate. If, during the fifth time-period 119 the substrate has failed to release from one side of the ESC, at least one and perhaps two of the lift pins cannot be raised. However, the third lift pin may still raise in this example. As a result, the substrate will be tilted. In an extreme case of the substrate failing to release from one or more portions of the ESC, the substrate may break. In either case, the reflectometer will detect that the substrate is either tilted or broken due to a smaller-than-expected magnitude of the normalized signal since the entire substrate is not at the fully-raised position.

In addition to substrate tilt and breakage problems, the substrate may experience an offset (a lateral shifting with reference to the ESC or substrate holder). The offset is also known as a dynamic alignment (DA) offset and may be due to an inconsistent release of a substrate from the ESC or other types of substrate holder. For example, portions of the substrate may be released before other portions, thereby resulting in a sliding and/or twisting motion of the substrate.

Alternatively, another error condition may arise if the reflectometer receives a signal from the pin controller that a pins-up operation is occurring, and the reflectometer does not sense any change in magnitude in the received signal. Therefore, such a condition may indicate that the entire substrate has failed to release from the ESC.

In various embodiments described herein, a signal is transmitted or is otherwise sent from an ESC controller to the reflectometer and from the reflectometer back to the ESC controller. Although this signaling between the ESC controller and the reflectometer is not shown explicitly herein, a person of ordinary skill in the art, upon reading and understanding the disclosure provided herein, will readily understand how to arrange a closed-loop control between the ESC and the reflectometer. Such a closed-loop arrangement is described in greater detail below, for example, with reference to FIG. 5.

With continuing reference to FIG. 1, in a specific exemplary embodiment, when the lift pins are in a raised ("pins-up position"), during the second time-period 113 and the fifth time-period 119, the reflectometer senses a signal that is increased in magnitude approximately 3% to about 4% across the entire broadband spectrum (260 nm to 800 nm) as compared with the lift, pins in a lowered position ("pins-down position") during portions of the first time-period 111 and the sixth time-period 121. Therefore, the feasibility of using the reflectometer to monitor movements of the substrate near or on an ESC during various time periods is robust and is independent of an interrogating wavelength of the reflectometer.

In a specific exemplary embodiment, provided merely as a point-of-reference for a skilled artisan, the "pins-up" lift height in this embodiment was about 9.5 mm±0.48 mm (approximately 0.375±0.019 inches) above an uppermost or top surface of the ESC. The "pins-down" depth in this embodiment was about 0.61 mm±0.48 mm (approximately 0.024±0.019 inches) below an uppermost or top surface of the ESC.

Although not shown explicitly on the exemplary graph 100 of FIG. 1, during the fourth time-period 117, the reflectometer may also be used to determine an end-point detection of certain processes applied to the substrate as described above. For example, the reflectometer may be used to determine when an etch process is completed since the received signal from the substrate will indicate that at least a portion of the substrate is now at a lower level than when the substrate was first clamped to the ESC.

Figure 2:
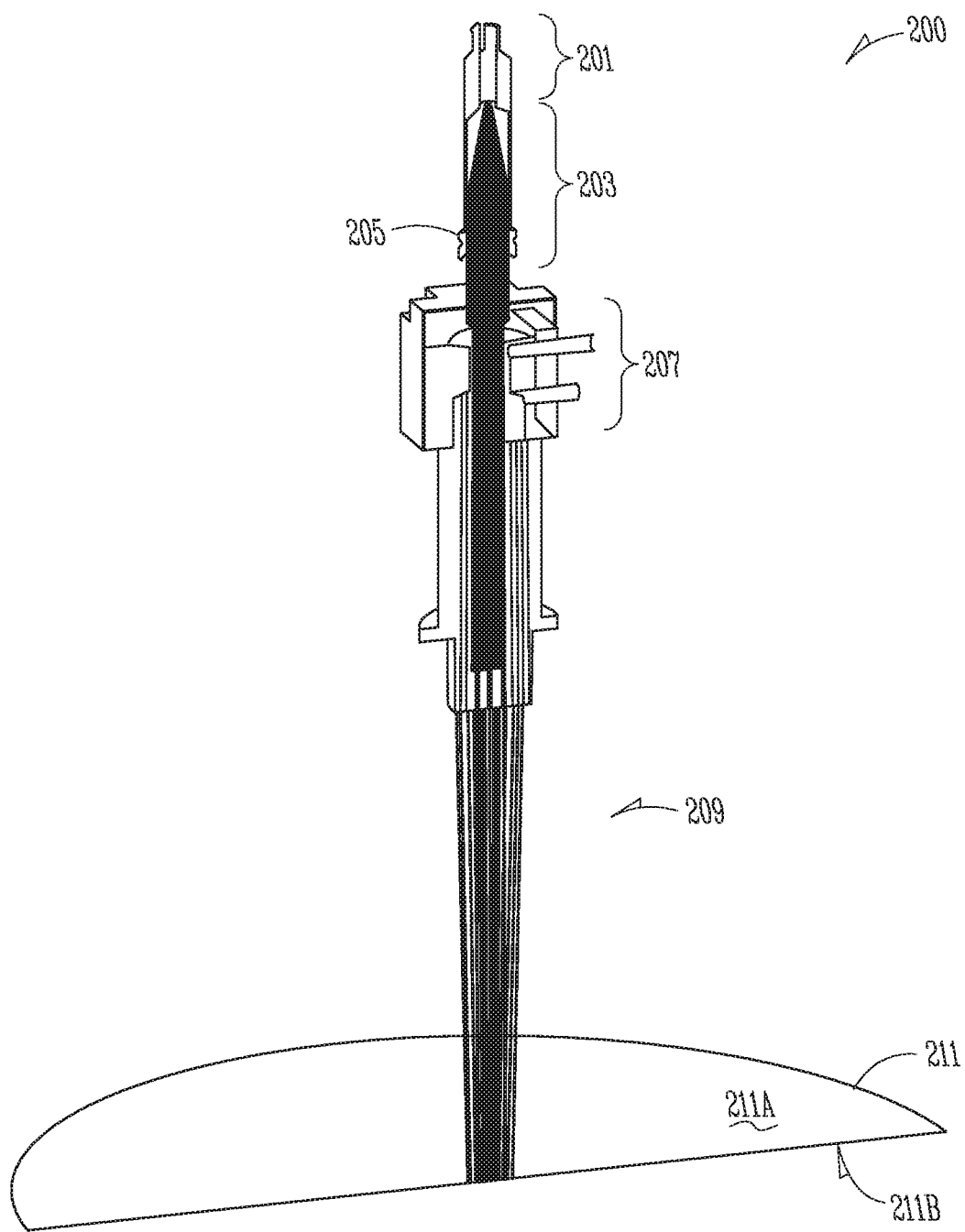
FIG. 2 shows an exemplary embodiment of a reflectometer interacting with a substrate in accordance with various embodiments described herein.

With reference now to FIG. 2, an exemplary embodiment of a reflectometer 200 interacting with a substrate 211 in accordance with various embodiments described herein is shown. The reflectometer 200 is shown to include a light source 201, a beam collimator 203, beam optics 205, a gas injector 207, and a light output 209. Depending upon an application of the reflectometer 200 interacting with the substrate 211, a person of ordinary skill in the art will recognize that some of the components described above may be optional.

The light source 201 may be a broadband light source as was used to create the exemplary graph 100 of FIG. 1 to test feasibility of the reflectometer 200. For example, the light source 201 may comprise a xenon source, such as the xenon flash-lamp. A xenon flash-lamp is an arc-discharge lamp that is capable of producing intense, broadband light (e.g., a full-range of primarily the visible spectrum) for short durations. Since the broadband spectrum produces a range of frequencies that vary in both amplitude and phase, the xenon flash-lamp has a short coherence period and is therefore considered an incoherent source.

In other embodiments, the light source 201 may be a monochromatic source, such as a laser or laser diode having an output wavelength, for example, in the visible spectrum. The laser may have either a continuous or pulsed output. In some embodiments, lasers having an output wavelength in the sub-visible or ultraviolet (UV) spectrum (e.g., a deep-UV (DUV) excimer laser or extreme-UV (EUV) laser-driven plasma light source) may be used as the light source 201. In still other embodiments, an infrared (IR) or near-infrared laser or laser diode may be used for the light source 201. In various embodiments, a number of light sources, on one or more reflectometers 200, may be incorporated. In such embodiments, a number of laser-light sources of different or the same wavelength may be used. In still other embodiments, a radiation source, such an x-ray source, electron-beam source, or ion-beam source, may be used as the light source 201.

Although the reflectometer 200 is shown in FIG. 2 to be at about a normal incidence angle (at or about perpendicular to an uppermost surface 211A) with reference to the substrate 211, the reflectometer 200 may actually be used at one or more incidence angles as described in more detail below with reference to FIG. 4.

Although not shown explicitly, in one embodiment, the light source 201 may also comprise reflected light collection optics as well (not shown explicitly but contained within the light source 201). The collection optics may comprise an optical detector. A person of ordinary skill in the art will recognize that, for example, if the light source 201 is at an angle-of-incidence that is normal to the substrate 211, light reflected from the substrate 211 will predominantly follow the same optical path back as was used to transmit the light to the substrate 211 initially. Therefore, the optical detector within the reflectometer 200 may be substantially coincident with or concentric to the light source 201. In this case, where the reflected light follows primarily the same path as the initially transmitted light followed (e.g., the reflected-light angle is about the same as the light source 201 angle-of-incidence), the resulting light signal is mixed (due to the combination of transmitted and reflected light), but is readily separable by techniques known in the art.

In one exemplary embodiment, the beam optics 205 may comprise a monochromator. A monochromator transmits a selectable narrow band of wavelengths of light or other radiation from a broadband source. The beam optics 205 may also comprise, in addition to or in place of the monochromator, beam formation and focusing optics, such as optical focusing elements (e.g., various forms of spherical, cylindrical, or gradient-index lenses). In embodiments, the beam optics 205 may comprise a waveplate or optical retarder that alters a polarization state of the light beam transmitted therethrough. Each of the aforementioned optical devices is known in the art.

For example, when at least a portion of the beam optics 205 comprises a cylindrical lens (negative or positive), the cylindrical lens produces a line of light, as opposed to a spot of light, across at least a portion of the substrate 211. Also, at least a portion of the beam optics 205 can comprise other types of beam scanning or line forming optics known in the art. For example, a polygonal mirror can be used to form a line of light across the substrate 211. In various embodiments, the polygonal mirror may be mounted either internal to or external to the reflectometer 200. A person of ordinary skill in the art will recognize how to form the line of light across an entire diameter of the substrate 211 or form the line across only a selected portion of the substrate 211 in order to monitor more than a single spot or point on the substrate 211.

The gas injector 207 portion of the reflectometer 200 is used to introduce or evacuate gases from a process chamber. In various embodiments (e.g., the embodiments described with reference to FIG. 4, below), the reflectometer 200 does not incorporate the gas injector 207. Instead, other means are used to inject gases into or evacuate gases from the process chamber. The gas injector 207 is known in the art and therefore will not be described further.

Depending upon a wavelength of the reflectometer 200 used to interrogate the substrate 211 and the material from which the substrate 211 is formed, a reflected signal may be reflected from the uppermost surface 211A of the substrate 211, the lower surface 211B of the substrate, or both surfaces. However, since the reflection may be consistent throughout the sampling period, it may be unimportant which surface is actually being detected. In other situations, however, a determination of a surface from which the signal is reflecting may be important.

For example, a determination of the surface may be at least partially dependent on a temperature of the substrate 211, a number and thickness of a film or layers of film material or materials added to the substrate 211 during a deposition process, an amount of etch performed on the substrate 211, a change in the index-of-refraction of intermediary gases between the reflectometer 200 and the substrate 211 (thereby potentially causing an effective change of incidence angle of the light output 209 on the substrate 211), or a number of other factors known to a person of ordinary skill in the art. As discussed below with reference to FIG. 4, such variables can be eliminated or reduced in importance by, for example, using multiple angles-of-incidence, multiple wavelengths, multiple polarization states, and so on. Each of these variables can be applied either sequentially or concurrently. Further, each of these variables is known to a person of ordinary skill in the art.

Figure 3A:
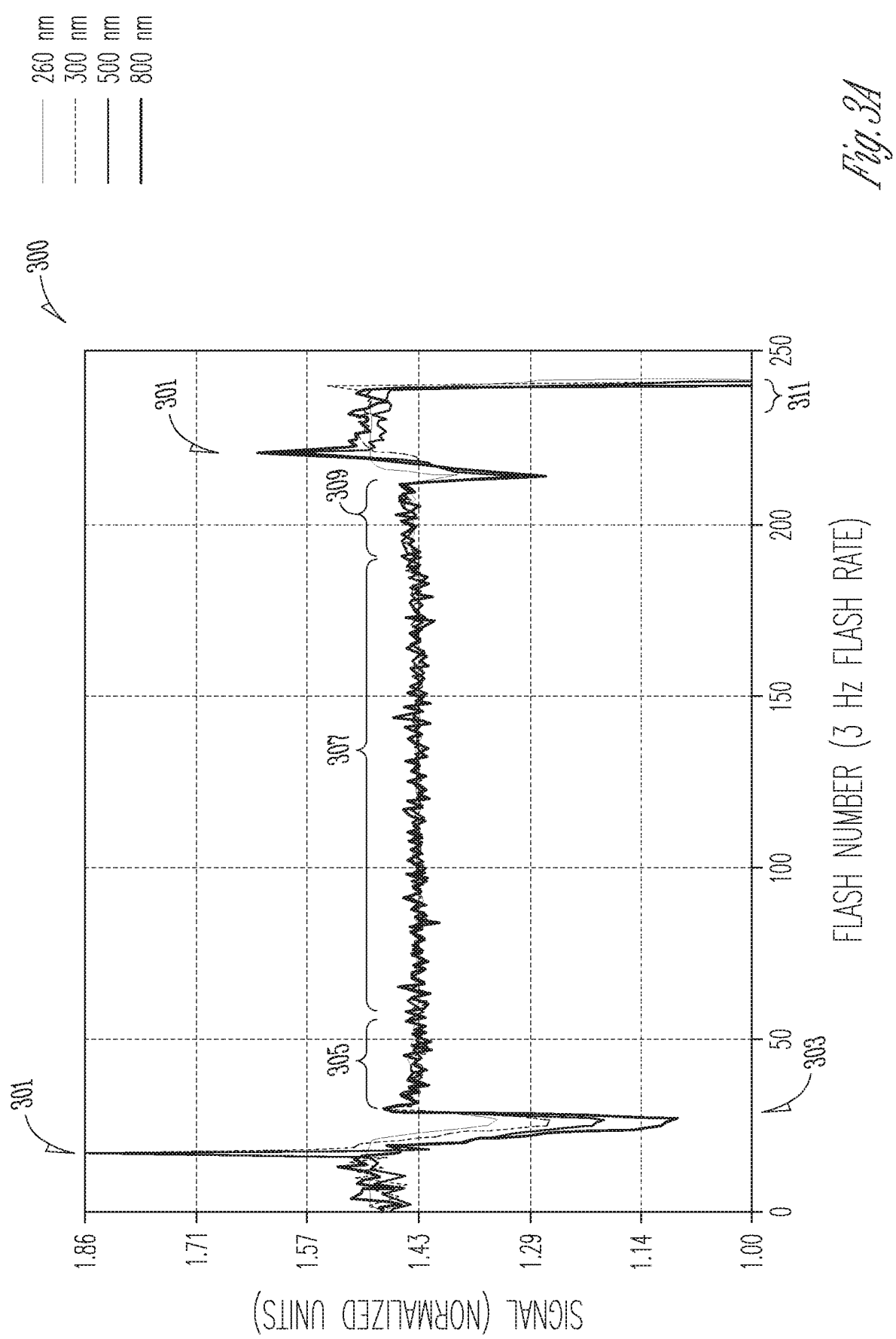
FIG. 3A shows an exemplary graph showing data from a second type of reflectometer to evaluate feasibility of the second type of reflectometer in monitoring movements of a substrate during various time periods near or on an ESC.

FIG. 3A shows an exemplary graph 300 showing data from a second type of reflectometer to evaluate feasibility of the second reflectometer in monitoring movement of a substrate near or on an ESC during various time periods. The second reflectometer is less expensive than the first reflectometer used to construct the exemplary graph 100 of FIG. 1, and also has a lower flash-rate than the first reflectometer (3 Hz for the second reflectometer versus 10 Hz for the first reflectometer). Additionally, the second reflectometer has a higher noise-floor and lower quality of components (e.g., flash lamps, spectrometer, optical fibers) than the first reflectometer used to construct the exemplary graph 100 of FIG. 1.

Similar to the exemplary graph 100 of FIG. 1 described above, the exemplary graph 300 is displayed as an electrical signal (in arbitrary, normalized units) received by a reflectometer (e.g., the reflectometer 200) from a substrate (e.g., the substrate 211 of FIG. 2). The substrate was reflecting light from the reflectometer and directed onto an uppermost surface 211A of the substrate 211. As with the reflectometer of FIG. 1, the reflectometer used in FIG. 3A uses a broadband source as the light source. However, the light source may be a monochromatic or other source of either light or radiation as described above with reference to FIG. 2.

A magnitude of the signal is shown as a function of flash number, which is indicative of either the frequency of the flash-lamp used for the broadband source, or how frequently the reflected signal from the substrate is sampled, or both. In this embodiment, the light source comprises a xenon flash-lamp. The signal is sampled at a rate of 3 Hz, which is also the flash rate of the xenon flash-lamp. Since this embodiment also uses a broadband source, FIG. 3A is shown to include a number of graph lines indicative of various wavelengths (e.g., those displayed in the exemplary graph 300 include a 260 nm line, a 300 nm line, a 500 nm line, and an 800 nm line) from the broadband source.

With continuing reference to FIG. 3A, peaks 301 in the exemplary graph 300 indicate that lift pins on the ESC are raised to a "pins-up position." However, an overall average signal of the lift pins in the up position is much lower than the peaks 301 as indicated by the graph lines near the peaks 301. The peaks 301 may be a remnant of the higher-noise level of the second reflectometer. Valleys 303 in the exemplary graph 300 indicate that the lift pins are lowered to a "pins-down position." During a first time-period 305, the substrate is in contact, or near contact, with an uppermost surface of the ESC. During a second time-period 307, one or more voltages are applied to the ESC and the substrate is electrostatically "clamped" to the ESC. It is during the second time-period 307 that processing (e.g., material deposition, etching operations, etc.) of the substrate takes place. However, in preparing and recording the data for the exemplary graph 300, no actual processing was performed.

After the end of the second time-period 307, the voltage or voltages applied to the ESC are removed during a third time-period 309 and the substrate is then raised by the lift pins to a "pins-up position". The end effector of the robotic arm then enters the process chamber and removes the substrate from the process chamber during a fourth time-period 311.

In a specific exemplary embodiment with this second reflectometer, when the lift pins are in a raised, pins-up position, and as indicated by the exemplary graph 300 of FIG. 3A, the reflectometer senses an averaged signal that is increased in magnitude approximately 3% to about 6% across (as opposed to the approximately 3% to about 4% for the first reflectometer as used in preparing the exemplary graph 100 of FIG. 1) over the entire broadband spectrum (260 nm to 800 nm) as compared with the lift pins in a lowered position ("pins-down position"). Therefore, the feasibility of using the second, less expensive reflectometer in monitoring movements of a substrate near or on an ESC during various time periods is also robust and is somewhat independent of an interrogating wavelength. However, as indicated by the peaks 301 and the valleys 303 of at least one of the wavelengths of FIG. 3A, there is additional noise with the second reflectometer that was not seen with the first reflectometer used to construct the exemplary graph 100 of FIG. 1.

Figure 3B:
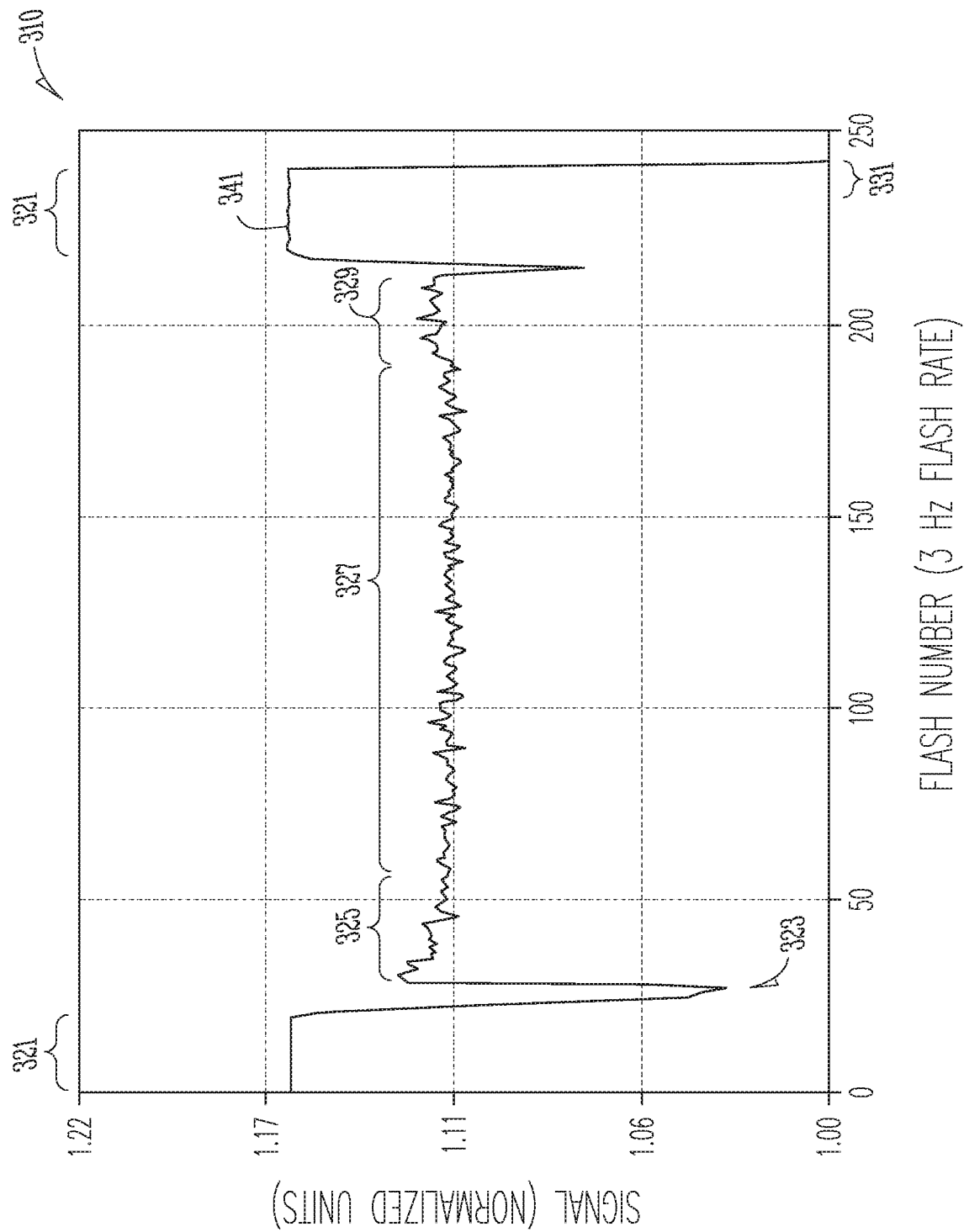
FIG. 3B shows an exemplary graph showing data from the second type of reflectometer, taken at a single wavelength, to evaluate feasibility of the second type of reflectometer in monitoring movements of a substrate during various time periods near or on an ESC.

FIG. 3B shows an exemplary graph 310 showing data from the second reflectometer, taken at only a single wavelength of 260 nm as indicated by a single graph-line 341 of FIG. 3B. Lift pins on the ESC are in a "pins-up position" during time-periods 321 both before and after processing of the substrate occurs. Before the process occurs, the substrate is placed on the lift pins and lowered down toward a surface of the ESC. Valleys 323 in the exemplary graph 310 indicate when the lift pins are lowered to a "pins-down position." During a first time-period 325, the substrate is in contact, or near contact, with an uppermost surface of the ESC. As described above, one or more voltages are applied to the ESC and the substrate is electrostatically "clamped" to the ESC during a second time-period 327. It is during the second time-period 327 that processing (e.g., material deposition, etching operations, etc.) of the substrate takes place. However, in preparing and recording the data for the exemplary graph 310, no actual processing was performed.

After the end of the second time-period 327, the voltage or voltages applied to the ESC are removed during a third time-period 329. The substrate is raised by the lift pins to a "pins-up position" during time period 321 and an end effector of a robotic arm then enters the process chamber and removes the substrate from the process chamber during a fifth time-period 331.

The response of the exemplary graph 310 of FIG. 3B is smoother than the exemplary graph 300 of FIG. 3A, thus indicating a lower noise level for the single wavelength of 260 nm output by the reflectometer. Consequently, in this example, the 260 nm wavelength that was used to create the single graph-line 341 is more stable, at about a 4.5% increase in magnitude across the exemplary graph 310, as compared with the increase in magnitude approximately 3% to about 6% across over the entire broadband spectrum (260 nm to 800 nm) in the exemplary graph 300 of FIG. 3A.

As noted above with reference to FIG. 1 the flash rate, and therefore the signal sample rate (since each flash was sampled), was 10 Hz. In FIGS. 3A and 3B, the flash rate, and therefore the signal sample rate (since each flash was sampled), was 3 Hz. However, upon reading and understanding the disclosure provided herein, a person of ordinary skill in the art will understand that a number of sampling rates may be used, at least partially dependent on how long the substrate is in the process chamber, how long an expected de-chuck is expected to take, and other factors. In one exemplary embodiment, a variable sampling rate may be selected. For example, a much longer sampling time period may occur while the substrate is in the chamber and undergoing a particular process. Then, a higher sampling rate (a lower sampling time period) may be used during a substrate de-chuck process.

However, if the process (e.g., an etch process occurs a high rate, a higher sampling rate may be used throughout the entire time the substrate is located in the process chamber. Based upon reading and understanding the disclosure provided herein, a person of ordinary skill in the art will recognize how frequently the sampling rate should occur for a given process and light source. For example, using a continuous light-source in the reflectometer may provide more flexibility regarding sampling rate as compared with a flash-lamp. In the case of the flash-lamp, the sampling rate will generally occur at integral multiples of the frequency of the flash-lamp.

Figure 4:
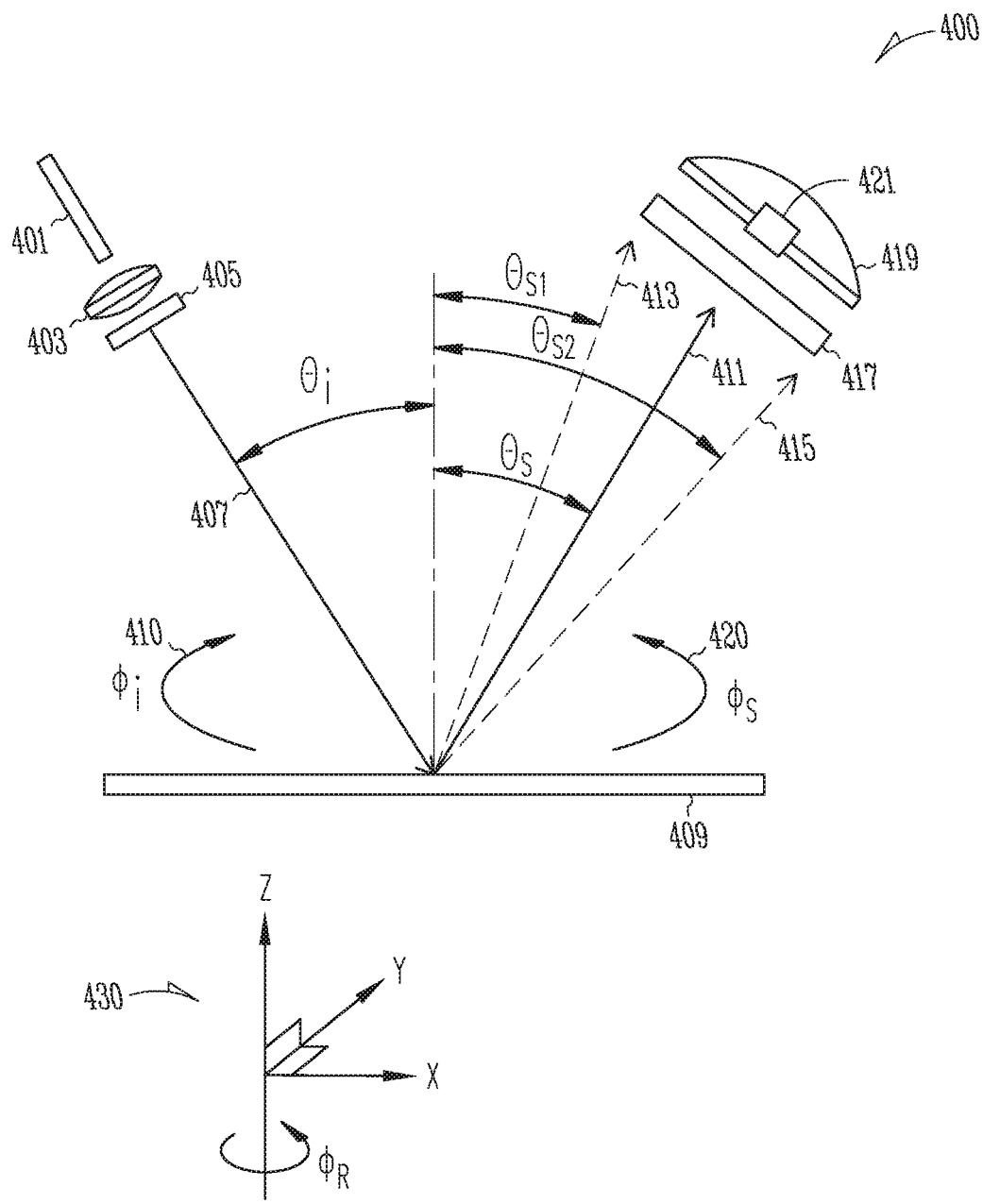
FIG. 4 shows an exemplary schematic diagram of another embodiment of a reflectometer based on incidence angle, collection angle, and other variable parameters used in various embodiments.

FIG. 4 shows an exemplary schematic diagram of another embodiment of a reflectometer 400 based on incidence angle, collection angle, and other variable parameters used in various embodiments. On the left-hand side of FIG. 4 are shown parameters relating to producing an interrogating beam, including related optics and other devices for forming the interrogating beam. On the right-hand side of FIG. 4 are shown parameters relating to collection optics for receiving reflected and scattered light from a substrate.

The left-hand side of FIG. 4 is shown to include a light source 401, beam optics 403, a beam modifier 405, and an incident-light output 407. The incident-light output 407 can be placed at one or more angles-of-incidence, $\theta_i$, with reference to a line perpendicular to an uppermost surface of a substrate 409. In various embodiments, the incident-light output 407 may also be placed at one or more azimuthal directions, $\varphi_i$, as indicated by an incident-light azimuthal-direction indicator 410. Thus, the incident-light output 407 may be at one or more angles-of-incidence, $\theta_i$, including variable angles-of-incidence, and/or one or more azimuthal directions, $\varphi_i$, including variable azimuthal directions, with reference to a plane in which FIG. 4 is drawn.

The light source 401 may be a broadband light source. For example, the light source 401 could be a xenon source, such as the xenon flash-lamp described as a possible component for the light source 201 described above with reference to FIG. 2. In other embodiments, the light source 401 may be a monochromatic source, such as a laser or laser diode having an output wavelength in the visible spectrum. The laser may have either a continuous or pulsed output. In embodiments, lasers having an output wavelength in the sub-visible or ultraviolet (UV) spectrum (e.g., a deep-UV (DUV) excimer laser or extreme-UV (EUC) laser-driven plasma light source) may be used as the light source 401. In still other embodiments, an infrared or near-infrared laser or laser diode may be used for the light source 401. In various embodiments, a number of light sources 401, on one or more reflectometers 400, may be incorporated. In such an embodiment, a number of laser-light sources of different or the same wavelength may be used. In still other embodiments, a radiation source, such an x-ray source, electron-beam source, or ion-beam source, may be used as the light source 401. For example, at certain stages in a process, a visible light source, such as a visible-light laser, may not be able to detect any x-y movement of the substrate 409 (although these same light sources can detect vibrational or z-direction movements). However, a radiation source that at least partially penetrates into the substrate 409 can be used to detect x-y movement of even a highly-polished substrate (e.g., such as a bare silicon wafer).

In one embodiment, the beam optics 403 may comprise various types of focusing optics, known in the art. In other embodiments, the beam optics 403 may comprise a waveplate or optical retarder, which alters a polarization state of light beam transmitted therethrough.

In various embodiments, the beam modifier 405 may comprise a monochromator. A monochromator transmits a selectable narrow band of wavelengths of light or other radiation from a broadband source. The beam modifier 405 may also comprise, in addition to or in place of the monochromator, beam formation and additional focusing or beam direction optics, such as optical focusing elements (e.g., various forms of spherical, cylindrical, or gradient-index lenses). Each of the aforementioned optical devices is known in the art.

For example, when at least a portion of the beam modifier 405 comprises a cylindrical lens (negative or positive), the cylindrical lens produces a line of light across at least a portion of the substrate 409. Also, at least a portion of the beam modifier 405 can comprise other types of beam scanning or line forming optics known in the art. For example, the beam modifier 405 may comprise a polygonal mirror that can be used to form a line of light across the substrate 409. In various embodiments, the polygonal mirror may be mounted either internal to or external to the reflectometer 400. A person of ordinary skill in the art will recognize how to form the line of light across an entire diameter of the substrate 409 or form the line across only a selected portion of the substrate 409. In other embodiments, the beam modifier 405 may comprise a cylindrical mirror to scan the incident-light output 407 across an entirety or a portion of the substrate 409.

With continuing reference to FIG. 4, the right-hand side of FIG. 4 is shown to include a reflected-light beam 411 (which may be a specularly reflected-light beam), at angle $\theta_s$, or angle-of-reflection, a collected-light modifier 417, collection optics 419, and a reflected-light beam stop 421.

In an embodiment, the collected-light modifier 417 may include various types of beam forming optics to, for example, focus collected light reflected from the substrate 409 onto the collection optics 419. In embodiments, the collected-light modifier 417 may include a waveplate or optical retarder that alters a polarization state of the light beam transmitted therethrough. In addition to or instead of the aforementioned components, the collected-light modifier 417 may comprise a fixed or variable aperture.

In an embodiment, the collection optics 419 may include a detector to detect a magnitude of a reflected- or scattered-light received from the substrate. Such a detector is known in the art and may include, for example, a photodetector (e.g., such as a p-n junction in a photodiode or phototransistor that converts photons of light into current). The detector may include charge-coupled devices (CCD), photoresistors, or other types of detector known in the art. If the light source 401 uses a source that produces UV, IR, or near-IR light, or if the expected reflected- or scattered-light signal received from the substrate 409 is extremely small, the detector may comprise a photomultiplier tube (PMT). The selection of various types of detectors for a given set of parameters (e.g., wavelength, expected signal response strength, etc.) is known in the art.

In an embodiment, the collection optics 419 may include optical lens elements (e.g., one or more aspherical lens elements, or parabolic or elliptical mirror elements) to focus reflected light or scatter light received from the substrate 409 onto the detector. If the reflected-light beam stop 421 is used with the collection optics, primarily only the scatter light received from the substrate will be detected by the collection optics 419. However, depending on a particular application, both the reflected-light beam 411 as well as the scattered (or diffuse) light may be used to collect a signal in the collection optics 419 received from the substrate 409. In this case, the reflected-light beam stop 421 is optional.

In various embodiments, a size of at least the collected-light modifier 417 and the collection optics 419 may be based on a desired range of scattered-light collection angles. For example, an upper collected-light scatter angle 413, at angle $\theta_{s1}$, and a lower collected-light scatter angle 415, at angle $\theta_{s2}$, may be selected based on a range of scattered-light angles that are predetermined to be of interest for, for example, a given substrate type and different types of process to be applied to the substrate 409. Such determinations are known to a person of ordinary skill in the art. Further, although the upper collected-light scatter angle 413, at angle $\theta_{s1}$, and the lower collected-light scatter angle 415, at angle $\theta_{s2}$, are shown as being symmetrical about the reflected-light beam 411, a skilled artisan will recognize that such symmetry in collection optics is not necessary and may vary considerably on either side of the reflected-light beam 411. The range of collected light angles may also be in a range of azimuthal directions, $\varphi_s$, as indicated by a collected-light azimuthal-direction indicator 420. Thus, the scattered-light collection angles may be at one or more azimuthal directions, $\varphi_s$, with reference to a plane in which. FIG. 4 is drawn. Also, each of the scattered-light collection angles may be varied by, for example, moving at least the collection optics 419 closer to or farther from the substrate 409. Such variable placement of the collection optics 419 may be useful depending on a chosen type of the substrate 409 and/or a particular stage in the process recipe.

Thus, in various embodiments, the reflectometer 400 may include a fixed or variable range of incidence angles and a fixed or variable range of collection angles, both in $\theta$ and $\varphi$, as indicated in FIG. 4.

In addition to determining a reflectivity of the substrate 409, the scattered light can also provide a microroughness value of the substrate 409. Further, by knowing the range of collection angles, and a wavelength (or wavelengths) of the interrogating beam in the incident-light output 407, a skilled artisan will recognize, based upon reading and understanding the disclosure provided herein, how to determine a true power-spectral density function based upon a determination of spatial-bandwidths associated with the reflectometer 400 of FIG. 4. Consequently, a true spatial-bandwidth determination of microroughness of the substrate 409 may be readily calculated and displayed, for example, on a GUI of the processing tool. Such a microroughness determination may also be used as part of an endpoint-process detection scheme.

In various embodiments, the reflectometer 400 may include one or more light sources to emit a beam of light or other radiation directed at the substrate at one or more angles-of-incidence. Additionally, at least one set of collection optics may be arranged at one or more reflected-light or scattered-light collection angles.

In various embodiments, it may be useful to translate a direction of the substrate 409 in, for example, an x-direction, a y-direction, and/or rotate the substrate 409, in $\varphi_R$, as shown by a triad indicator 430 of FIG. 4. Mechanisms to implement such translations are known in the art.

Figure 5:
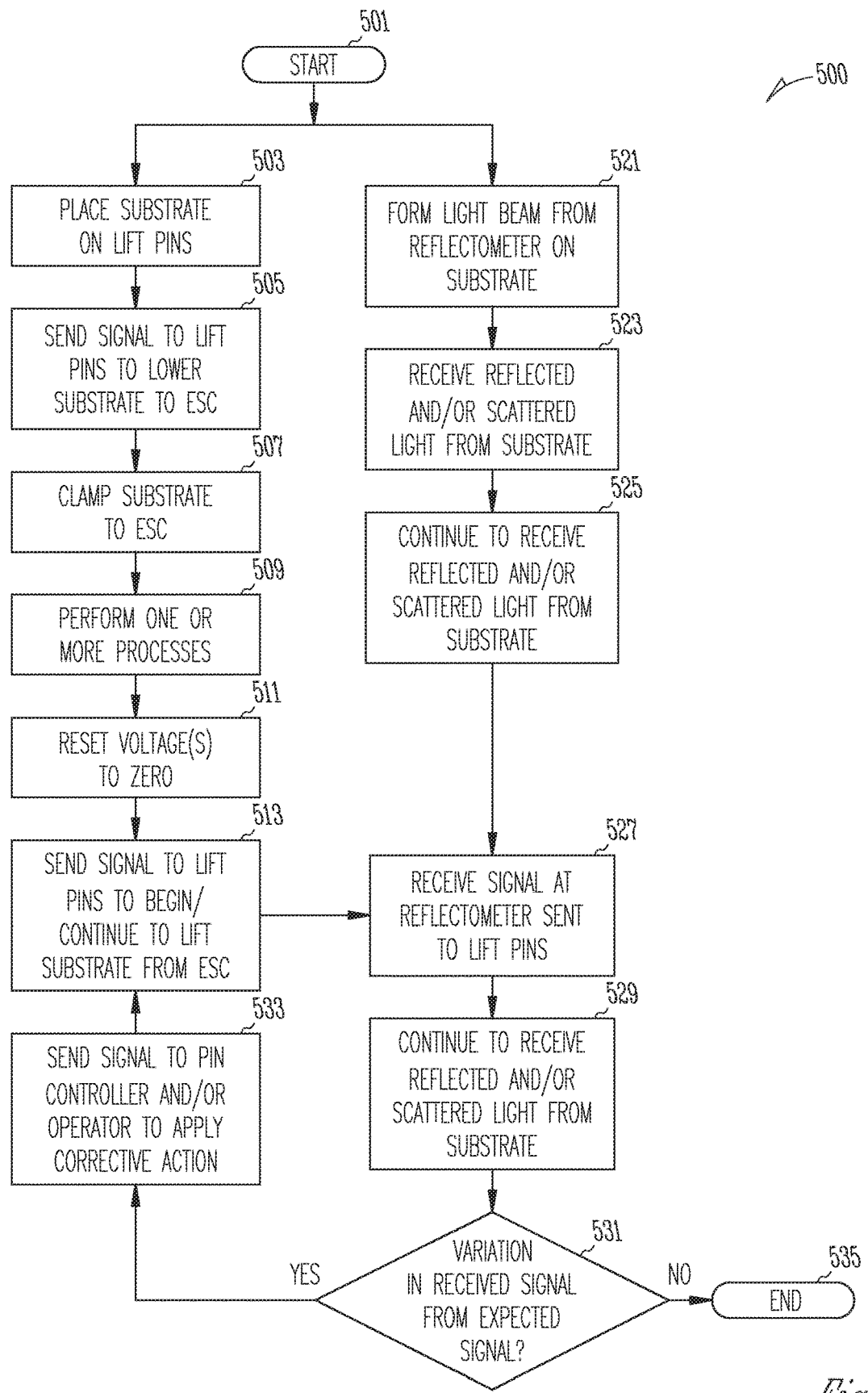
FIG. 5 shows an exemplary method for monitoring movement of a substrate in accordance with various embodiments described herein.

Referring now to FIG. 5, an exemplary method 500 for monitoring movements of a substrate in accordance with various embodiments described herein is shown. At operation 501, the exemplary method 500 is started. Two parallel processes for the exemplary method 500 are performed substantially simultaneously—a left-side branch of the exemplary method 500—relating primarily to procedures occurring with the substrate—and a right-side branch of the exemplary method 500—relating primarily to operations of the reflectometer. However, as discussed herein, both sides of the branches are interrelated according to various embodiments described.

Beginning on the left-side branch, at operation 503 a substrate is placed on the lift pins of the ESC (or other substrate holder). At operation 505, a lift pin controller sends a signal to the lift, pins to lower the substrate down to or near a surface of the ESC. At operation 507, the substrate is electrostatically clamped to the ESC by applying one or more voltages to the ESC as described above. At operation 509, one or more processes (e.g., material deposition or etching) are performed on the substrate. Once the processes are completed, one or more voltages applied earlier to the ESC at operation 507 are now reset to zero volts at operation 511.

At operation 513, once the voltage(s) to the ESC are reset to zero, the lift pin controller sends a signal to the lift pins to begin to lift the substrate from the ESC (or, as discussed below with regard to operation 533, the lift pins are to continue to lift the substrate from the ESC). Substantially at the same time the pin controller is sending a signal to the lift pins, the lift pin signal is also being received at the reflectometer at operation 527. The operation 527 is described in more detail below.

Beginning at the top of the right-side branch of the exemplary method 500, at operation 521 a beam (e.g., a spot or line) of light (or other form of radiation as discussed above) is formed at one or more locations on the substrate.

Although not shown explicitly in FIG. 5, in a specific exemplary embodiment, the beam of light may also be formed on an uppermost surface of the ESC, prior to the substrate being placed on the ESC. In this specific exemplary embodiment, a reflected- or scattered-light signal received from the ESC may be compared with an expected or a predetermined signal for the ESC (e.g., stored in a database or predetermined to have a stored or calculated value of a received signal amplitude as measured by the reflectometer).

Although such embodiments are not explicitly described herein, a person of ordinary skill in the art, upon reading and understanding the disclosure provided herein, especially after considering the exemplary graphs of FIGS. 1, 3A, and 3B, will recognized how to construct such a database or determining or calculating a magnitude of a received signal. Knowing the expected signal received by the reflectometer from the ESC, and comparing the actual received signal (e.g., a magnitude of the signal) with the expected signal, allows an operator (e.g., a process engineer) of the processing system to know when particular maintenance issues may need to be performed on the ESC. For example, based on a determination that the actual received signal does not match the expected signal, may be indicative that bolts holding the ESC to a remainder of the process chamber have loosened or that a microroughness level of the uppermost surface of the ESC has become overly smooth (e.g., due to interactions with substrates, a smoothened surface (reduced microroughness) of the ESC scatters less light, thereby increasing a magnitude of the reflected light level). In this case, the ESC may need to be resurfaced. In this specific exemplary embodiment, the signal received by the reflectometer may set off an alarm or other annunciator (e.g., a display on the GUI of the system) based on the determination that the actual received signal does not match the expected signal.

With continuing reference to the right-side branch of the exemplary method 500, at operation 523, the reflectometer receives reflected light and/or scattered light from the substrate. As described above, the reflectometer may receive signals continuously or at predetermined time intervals.

At operation 525, the reflectometer continues to receive reflected light and/or scattered light signals from the substrate at continuous or predetermined time intervals.

At operation 527, and substantially at the same time the pin controller is sending a signal to the lift pins at operation 513 on the left-side branch, the signal to raise the lift, pins is also being received at the reflectometer at operation 527. Therefore, hardware, firmware, or software (all known to a skilled artisan) within the reflectometer receive an indication that the lift pins are about to begin (or continue) lifting the substrate from the ESC. At this point, and with consideration now to operation 529, the reflectometer is monitoring the substrate for potential signals that are indicative of the substrate bending, tilting, sliding, etc. by comparing an actual received reflected or scattered light signal with an expected signal or predetermined signal for the substrate (e.g., stored in a database or predetermined to have a stored or calculated value of a received signal amplitude as measured by the reflectometer). A person of ordinary skill in the art will recognize that the expected or predetermined signal (e.g., stored in a database or calculated) may need to be determined for a given type of substrate (e.g., a quartz photomask versus a silicon wafer) at a given stage in a process recipe (e.g., added dielectric or conductive film(s) or film layer(s), or other processes, such as an etch), may change one or both of the reflected light and scattered light expected levels received from the substrate. However, such processes are known in the art and may be readily determined, either, for example, experimentally or computationally.

Although such embodiments are not explicitly described herein, a person of ordinary skill in the art, upon reading and understanding the disclosure provided herein, especially after considering the exemplary graphs of FIGS. 1, 3A, and 3B, will recognized how to construct such a database or determining or calculating a magnitude of a received reflected light or scattered light signal.

At operation 531, a variation in the received signal is compared with the expected signal for predetermined differences of variations between the two signals. If there is not any variation (within the predetermined level of variation), then the exemplary method 500 for monitoring movements of the substrate ends at operation 535.

If however, at operation 531, the variation from the actual received signal to the expected signal is above a predetermined value (e.g., a threshold level of one part of the signal to another), at operation 533 a signal is sent from the reflectometer to the lift pin controller and/or the operator to apply corrective action. In this specific exemplary embodiment, the signal received by the reflectometer may set off an alarm or other annunciator (e.g., a display on the GUI of the system) based on the determination that the actual received signal does not match the expected signal.

At operation 533, in a first embodiment, a closed-loop control between the reflectometer and the lift pin controller allows the lift pin controller at operation 513 to increase pressure to one or more of the lift pins to correct the detected potential failure-mode. For example, if the signal received by the reflectometer indicates that the substrate has failed to be moved from the ESC after the lift pin controller has sent the signal to begin lifting the substrate at operation 513, then the lift pin controller may be directed to slowly (e.g., slower than a predetermined normal lift speed) apply additional pressure to the lift pins in an attempt to free the substrate from the ESC. The reflectometer, at operation 527, receives the signal that an increased pressure has been applied to the lift pins and the reflectometer, at operations 529 and 531, continues to monitor the reflected and/or scattered light received from the substrate.

In another example, if the signal received by the reflectometer indicates that the substrate is tilting while being moved from the ESC after the pin controller has sent the signal to begin lifting the substrate at operation 513, then the lift pin controller may be directed to slowly (e.g., slower than a predetermined normal lift speed) apply additional pressure to one or more of the lift pins to attempt to level the substrate as the substrate is being removed from the ESC. The reflectometer, at operation 527, receives the signal that an increased pressure has been applied to the lift pins and the reflectometer, at operations 529 and 531, continues to monitor the reflected and/or scattered light received from the substrate.

In a second embodiment, an open-loop control system is implemented whereby the reflectometer, in a similar fashion as indicated above with regard to the closed-loop system, an alarm or other annunciator alerts the operator of the system that a potential failure mode is occurring. The operator may then manually apply one or more of the corrective measures to the lift pin controller that would have been applied automatically in the closed-loop system as indicated above.

In any of the examples above, both the closed-loop system and the open-loop system (through intervention by the operator) may also implement corrective measures to avoid breaking a substrate. For example, software embedded in the pressure control system (e.g., the lift pin controller combined with pneumatic actuators attached to the lift pins) may be used to determine a breakage threshold for a given substrate type. Such software can include a lookup table or governing equations that includes a type of semiconductor or other material (e.g., silicon, germanium, gallium-arsenide and other compound semiconductors, quartz, etc.), stress-strain curves or stress-strain equations for the material, fracture point as a function of temperature, etc.). The lookup tables can also include variables affecting the stress-strain curves for a given material (e.g., added stress on the substrate due to added material layers). By combining these additional factors related to the breakage threshold, the amount of added pressure on the one or more of the lift pins may be considered to either limit the amount of pressure applied to one or more of the lift pins and/or increase the amount of pressure to approach more slowly the breaking or fracture limit.

Although applying pressure to the lift pins more slowly does decrease an overall substrate throughput, an advantage is that the number of substrates being broken is reduced or eliminated. As a skilled artisan recognizes, a broken substrate can equate to an extremely large loss of revenue (dependent on factors such as a number of devices formed on the substrate, percentage of completion of the devices on the substrate, a value of the devices on the substrate (e.g., microprocessors being formed on the substrate is generally more valuable than general-purpose logic being formed), etc.). In addition to the lost revenue from the devices, the processing system would need to undergo a complete maintenance check to eliminate deleterious effects from a broken substrate before the tool (e.g., a process tool) can be used again.

Based upon reading and understanding the disclosure provided herein, a person of ordinary skill in the art will recognize that other control options may be implemented. For example, if there is no problem detected by the reflectometer at operations 527 and 529, the reflectometer may send a signal to the lift pin controller to raise the lift pins more quickly so as to increase a throughput of substrates through the processing tool. Additionally, the reflectometer can be used to monitor how quickly the lift pins raise and lower the substrate to avoid any vibrational-induced movement (e.g., bouncing) of the substrate while being moved towards or away from the ESC or other substrate-holding device.

In other examples, the reflectometer can be used to optimize a helium (He) flow on and helium pump-down time constant to increase substrate throughput.

In other examples, the reflectometer can be used to provide fault detection for active clamping of a substrate. Active clamping technology is used to adjust clamping force of the substrate to the ESC to, for example, balance substrate-backside He pressure. In a specific exemplary embodiment, the clamping force can be adjusted in a step-to-step change in a process recipe to minimize charge accumulation on the substrate (e.g., adjusting the clamping force enables high-temperature ESC operation (e.g., greater than approximately 140° C.).

In other examples, the reflectometer can be used for other fault detection such as, for example, metal contamination of the ESC, which can be determined by an unexpected release of the substrate from the ESC or failure of the substrate to clamp to the ESC.

In other examples, the reflectometer can emit light and receive light and analyze a time-decay of light-sensitive material to measure a temperature of the substrate.

In other examples, the reflectometer can be used to monitor any bow in a substrate due to thermal expansion of the substrate and send corrective signals to a heater and/or chiller to take corrective actions to minimize the bow by means known in the art.

In another example, the reflectometer can be used to detect bow in a substrate due to an excessive clamping force between the ESC and the substrate. If the bow is excessive, the reflectometer can send an appropriate signal to the ESC to reduce the clamping force.

In yet another example, the reflectometer can be used to determine a dithering angle of a substrate (e.g., from a patterned wafer or sensing an actual position of a notch or flat on the substrate) by rotating a polarization angle (e.g., through the beam modifier 405) of the incident-light output 407 (see FIG. 4). If the dithering angle is off (the substrate is not properly aligned with the pattern or the notch or flat), the reflectometer can send a control signal to the robotic arm to rotate subsequently-placed substrates appropriately before releasing the substrate onto the lift pins.

Based on the description provided above, a person of ordinary skill in the art will understand that residual substrate chucking forces are frequently inevitable. The disclosed subject matter describes a number of embodiments to recognize when residual substrate chucking is occurring and how to reduce or minimize deleterious effects, such as substrate breakage.

Overall, the disclosed subject matter contained herein describes or relates generally to operations of "tools" in a semiconductor fabrication environment (fab) and allied industries. Such tools can include various types of deposition (including plasma-based tools such as ALD (atomic layer deposition), CVD (chemical vapor deposition), PECVD (plasma-enhanced CVD), etc.) and etching tools (e.g., reactive-ion etching (RIE) tools), as well as various types of thermal furnaces (e.g., such as rapid thermal annealing and oxidation), ion implantation, and a variety of other process and metrology tools found in various fabs and known to a person of ordinary skill in the art. However, the disclosed subject matter is not limited to semiconductor environments and can be used in a number of machine-tool environments such as robotic assembly, manufacturing, and machining environments where similar processes are used.

Upon reading and understanding the disclosure provided herein, a person of ordinary skill in the art will recognize that various embodiments of the disclosed subject matter relating to the reflectometer may be used with other types of substrate-holding devices, in addition to an ESC. For example, various types of cleaning, metrology, and process tools used in the semiconductor and allied industries use, for example, vacuum-controlled substrate-holding devices. For example, various types of substrate-holding devices may have problems with substrate sticking or otherwise adhering to the substrate-holding devices due to forces such as molecular adhesion, Van der Waal forces, electrostatic forces, and other near-field contact forces.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

As used herein, the term "or" may be construed in an inclusive or exclusive sense. Further, other embodiments will be understood by a person of ordinary skill in the art upon reading and understanding the disclosure provided. Further, upon reading and understanding the disclosure provided herein, the person of ordinary skill in the art will readily understand that various combinations of the techniques and examples provided herein may all be applied in various combinations.

Although various embodiments are discussed separately, these separate embodiments are not intended to be considered as independent techniques or designs. As indicated above, each of the various portions may be inter-related and each may be used separately or in combination with other embodiments. For example, although various embodiments of methods, operations, and processes have been described, these methods, operations, and processes may be used either separately or in various combinations.

Consequently, many modifications and variations can be made, as will be apparent to a person of ordinary skill in the art upon reading and understanding the disclosure provided herein. Functionally equivalent methods and devices within the scope of the disclosure, in addition to those enumerated herein, will be apparent to the skilled artisan from the foregoing descriptions. Portions and features of some embodiments may be included in, or substituted for, those of others. Such modifications and variations are intended to fall within a scope of the appended claims. Therefore, the present disclosure is to be limited only by the terms of the appended claims, along with the full scope of equivalents to which such claims are entitled. It is also to be understood that the terminology used herein is for the purpose of describing particular embodiments only and is not intended to be limiting.

The Abstract of the Disclosure is provided to allow the reader to quickly ascertain the nature of the technical disclosure. The abstract is submitted with the understanding that it will not be used to interpret or limit the claims. In addition, in the foregoing Detailed Description, it may be seen that various features may be grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. A reflectometry system to monitor and control conditions associated with a substrate disposed within a process chamber, the process chamber including a substrate-holding device having an actuator mechanism configured to control movement of the substrate with respect to the substrate-holding device, the reflectometry system comprising:
   a light source configured to emit a beam of light directed at the substrate;
   collection optics configured to receive light reflected from the substrate by the beam of light directed at the substrate and output a signal related to one or more conditions associated with the substrate; and
   a processor configured to process the signal and direct the actuator mechanism to control the movement of the substrate with respect to the substrate-holding device based on the signal.

2. The reflectometry system of claim 1, wherein the collection optics include an optical detector.

3. The reflectometry system of claim 2, wherein the processor is configured to indicate a change in position of the substrate due to a change in distance between the substrate and the optical detector, the change in position being based on a detected change in a magnitude of the light reflected from the substrate as measured by the optical detector.

4. The reflectometry system of claim 2, wherein the optical detector is substantially coincident with the light source.

5. The reflectometry system of claim 2, wherein the optical detector is substantially concentric to the light source.

6. The reflectometry system of claim 1, further comprising beam optics.

7. The reflectometry system of claim 6, wherein the beam optics includes a cylindrical lens configured to produce a line of light on at least a portion of the substrate.

8. The reflectometry system of claim 6, wherein the beam optics includes a spherical lens configured to produce a spot of light on at least a portion of the substrate.

9. The reflectometry system of claim 6, wherein the beam optics includes a waveplate configured to alter a polarization state of the light beam transmitted therethrough.

10. The reflectometry system of claim 1, wherein the light source is at about a normal incidence angle with reference to an uppermost surface of the substrate.

11. The reflectometry system of claim 1, wherein the collection optics are at about a normal reflected-light angle with reference to an uppermost surface of the substrate.

12. The reflectometry system of claim 1, wherein the light source comprises a broadband source.

13. The reflectometry system of claim 12, further comprising a monochromator configured to transmit a selectable narrow band of one or more wavelengths of light from the broadband source.

14. The reflectometry system of claim 1, wherein the collection optics include a waveplate configured to alter a polarization state of the light reflected from the substrate transmitted therethrough.

15. The reflectometry system of claim 1, wherein the processor is further configured to provide a notification based on a determination that the signal indicates the substrate is out of position with respect to the substrate-holding device.

16. The reflectometry system of claim 1, wherein the processor is further configured to take corrective action based on a determination that the signal indicates the substrate is out of position with respect to the substrate-holding device.

17. The reflectometry system of claim 1, wherein the processor is further configured to direct the actuator mechanism to realign the substrate with respect to the substrate-holding device based on a determination that the signal indicates that the substrate has moved, or is about to move, out of position.

18. The reflectometry system of claim 1, wherein the processor is further configured to direct the actuator mechanism to adjust a speed of raising the substrate from the substrate-holding device based on a determination as to whether the signal indicates that the substrate has been, or is likely to be, successfully de-chucked from the substrate-holding device.

19. The reflectometry system of claim 18, wherein the actuator mechanism is directed to increase the speed of raising the substrate from the substrate-holding device based on a determination that the signal indicates that the de-chucking of the substrate from the substrate-holding device is, or is likely to be, successful.

20. The reflectometry system of claim 18, wherein the actuator mechanism is directed to decrease the speed of raising the substrate from the substrate-holding device if the signal indicates that the de-chucking of the substrate from the substrate-holding device is not, or is not likely to be, successful.

21. The reflectometry system of claim 1, wherein the processor is further configured to direct the actuator mechanism to adjust a speed of raising or lowering the substrate with respect to the substrate-holding device based on a determination as to whether the signal indicates there is excessive vibration on the substrate.

22. The reflectometry system of claim 1, wherein the processor is further configured to provide a notification for inspection of the actuator mechanism based on a determination that the signal indicates that there is excessive vibration on the substrate.

23. The reflectometry system of claim 1, wherein the processor is further configured to determine a dithering angle of the substrate based on the signal and cause adjustment to be made based on the dithering angle for positioning a subsequent substrate with respect to the substrate-holding device.

24. The reflectometry system of claim 1, wherein the processor is further configured to take corrective action based on a determination the signal indicates that there is an excessive bow on the substrate.

25. The reflectometry system of claim 24, wherein the corrective action includes directing the substrate-holding device to adjust at least one of a clamping force on the substrate and a temperature on the substrate.

26. A reflectometer to monitor movements of a substrate, the reflectometer comprising:
- at least one light source configured to emit a beam of radiation directed at the substrate at one or more angles-of-incidence, with reference to a line perpendicular to an uppermost surface of the substrate;
- at least one set of collection optics configured to receive both light reflected from the substrate and light scattered by the substrate from the beam of radiation directed at the substrate and output a signal related to the movements of the substrate, the at least one set of collection optics being separate from the at least one light source and configured to be placed at a predetermined angle-of-reflection, the at least one set of collection optics further being configured to be sized based on a desired range of scattered-light collection angles for a given substrate type and a process applied to the substrate; and
- a processor configured to process the signal and direct an actuator mechanism to control the movement of the substrate with respect to a substrate-holding device based on the signal.

27. The reflectometer of claim 26, wherein the at least one light source is configured to have variable azimuthal directions.

28. The reflectometer of claim 26, wherein the at least one set of collection optics is configured to receive radiation at one or more angles-of-reflection.

29. The reflectometer of claim 26, wherein the at least one set of collection optics is configured to receive radiation from one or more azimuthal directions.

* * * * *